United States Patent
Park et al.

(10) Patent No.: US 12,336,283 B1
(45) Date of Patent: Jun. 17, 2025

(54) THREE-DIMENSIONAL STACKED SEMICONDUCTOR DEVICE INCLUDING SIMPLIFIED SOURCE/DRAIN CONTACT AREA

(71) Applicant: SAMSUNG ELECTRONICS CO., LTD., Suwon-si (KR)

(72) Inventors: Keumseok Park, Slingerlands, NY (US); Edward Namkyu Cho, Albany, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/947,649

(22) Filed: Nov. 14, 2024

Related U.S. Application Data

(60) Provisional application No. 63/644,209, filed on May 8, 2024.

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .... H10D 84/856; H10D 30/014; H10D 30/43; H10D 30/6729; H10D 30/6735;
(Continued)

(56) References Cited

U.S. PATENT DOCUMENTS 10,192,819 B1 * 1/2019 Chanemougame .... H10D 30/43
10,553,678 B2    2/2020 Lee et al.
(Continued)

*Primary Examiner* — Victor A Mandala
(74) *Attorney, Agent, or Firm* — Sughrue Mion, PLLC

(57) ABSTRACT

Provided is a semiconductor device which includes: a $1^{st}$ source/drain pattern for a $1^{st}$ transistor; a $2^{nd}$ source/drain pattern for a $2^{nd}$ transistor, above the $1^{st}$ source/drain pattern, the $2^{nd}$ source/drain pattern having a smaller width than the $1^{st}$ source/drain pattern in a channel-width direction; a $1^{st}$ isolation layer surrounding the $1^{st}$ source/drain pattern; a $2^{nd}$ isolation layer surrounding the $2^{nd}$ source/drain pattern, the $1^{st}$ and $2^{nd}$ isolation layers including a first material; a liner surrounding the $1^{st}$ source/drain pattern, the liner including a $2^{nd}$ material; and a contact structure on the $1^{st}$ source/drain pattern, wherein the contact structure penetrates the $2^{nd}$ isolation layer and the liner to contact the $1^{st}$ source/drain pattern without penetrating the $1^{st}$ isolation layer.

20 Claims, 13 Drawing Sheets

(51) Int. Cl.
*H10D 30/43* (2025.01)
*H10D 30/67* (2025.01)
*H10D 62/10* (2025.01)
*H10D 62/13* (2025.01)
*H10D 84/01* (2025.01)
*H10D 84/03* (2025.01)
*H10D 88/00* (2025.01)

(52) U.S. Cl.
CPC ..... *H10D 30/6729* (2025.01); *H10D 30/6735* (2025.01); *H10D 30/6757* (2025.01); *H10D 62/121* (2025.01); *H10D 62/151* (2025.01); *H10D 84/017* (2025.01); *H10D 84/0186* (2025.01); *H10D 84/0188* (2025.01); *H10D 84/038* (2025.01); *H10D 88/01* (2025.01)

(58) Field of Classification Search
CPC ............ H10D 30/6757; H10D 62/121; H10D 62/151; H10D 84/017; H10D 84/0186; H10D 84/0188; H10D 84/038; H10D 88/01
See application file for complete search history.

(56) References Cited

U.S. PATENT DOCUMENTS

| | | | |
|---|---|---|---|
| 11,069,684 B1* | 7/2021 | Xie | H01L 21/02603 |
| 11,164,793 B2 | 11/2021 | Xie et al. | |
| 11,894,433 B2 | 2/2024 | Reznicek et al. | |
| 12,119,271 B1* | 10/2024 | Liao | H10D 84/85 |
| 12,154,946 B2* | 11/2024 | Li | H10D 64/018 |
| 2017/0069630 A1* | 3/2017 | Cha | H10D 62/115 |
| 2021/0351297 A1* | 11/2021 | Zhu | H10D 84/0128 |
| 2022/0108981 A1* | 4/2022 | Hwang | H10D 84/82 |
| 2023/0011474 A1* | 1/2023 | Yu | H10D 84/0158 |
| 2023/0074880 A1* | 3/2023 | Park | H10D 62/121 |
| 2023/0187551 A1* | 6/2023 | Cheng | H10D 30/031 257/369 |
| 2023/0268388 A1* | 8/2023 | Xie | H10D 88/01 257/288 |
| 2023/0361112 A1* | 11/2023 | Hong | H10D 84/619 |
| 2023/0402519 A1* | 12/2023 | Anderson | H10D 84/0128 |
| 2023/0420303 A1* | 12/2023 | Young | H10D 88/00 |
| 2024/0030284 A1* | 1/2024 | Kang | H10D 88/01 |
| 2024/0072052 A1 | 2/2024 | Chung et al. | |
| 2024/0162309 A1* | 5/2024 | Yang | H10D 30/014 |
| 2024/0304669 A1* | 9/2024 | Park | H10D 30/014 |
| 2024/0339452 A1* | 10/2024 | Anderson | H10D 88/00 |
| 2024/0371933 A1* | 11/2024 | Lin | H10D 30/6735 |
| 2024/0379749 A1* | 11/2024 | Chen | H10D 30/024 |
| 2024/0379759 A1* | 11/2024 | Loh | H10D 62/151 |
| 2024/0379780 A1* | 11/2024 | Park | H10D 62/121 |
| 2024/0413213 A1* | 12/2024 | Park | H10D 84/038 |
| 2025/0006741 A1* | 1/2025 | Wang | H10D 84/0186 |
| 2025/0031419 A1* | 1/2025 | Hu | H10D 30/6735 |
| 2025/0031444 A1* | 1/2025 | Yun | H10D 84/0167 |

* cited by examiner

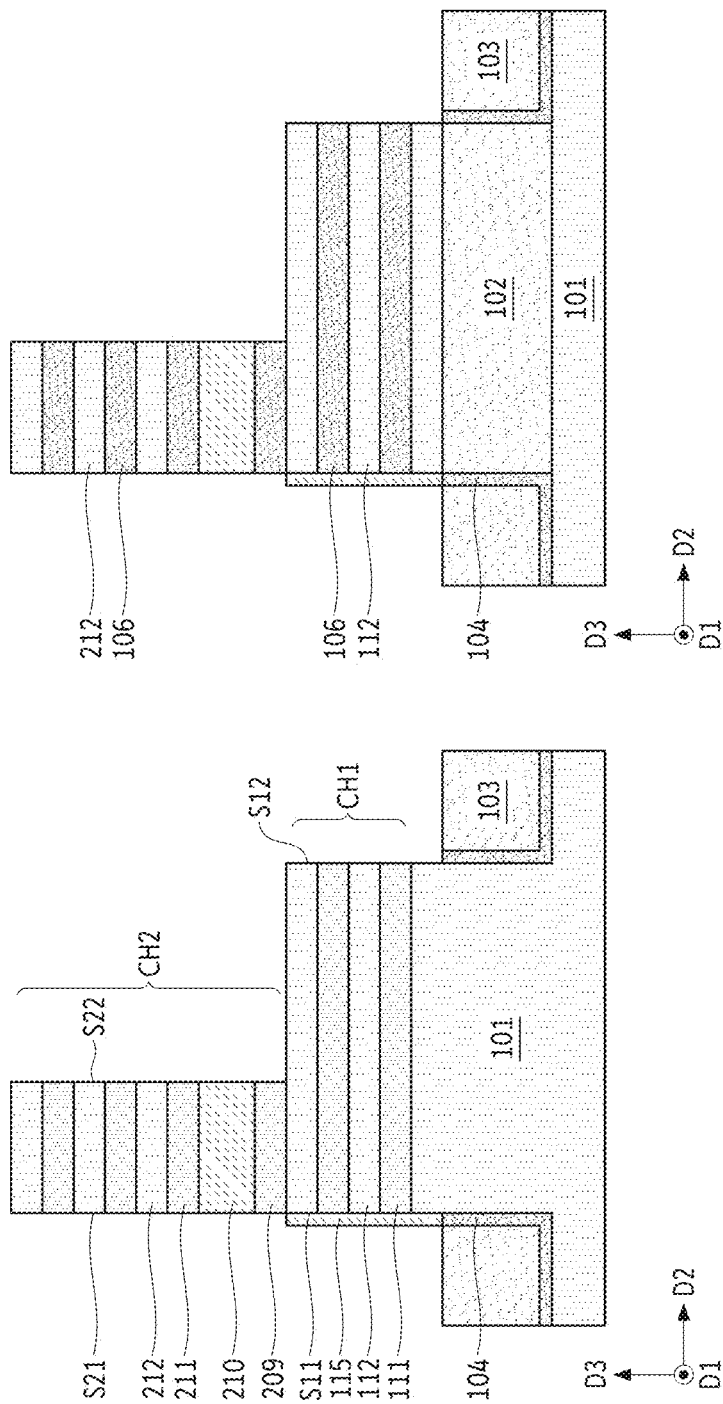

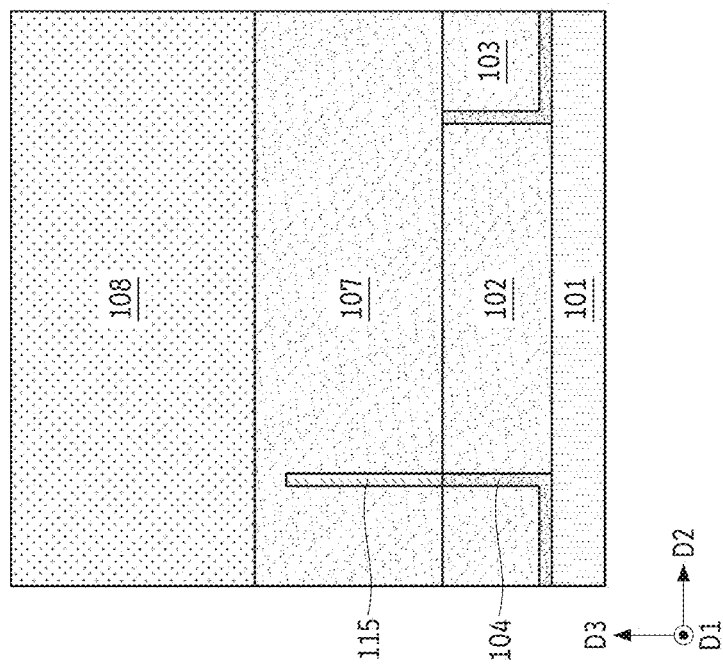
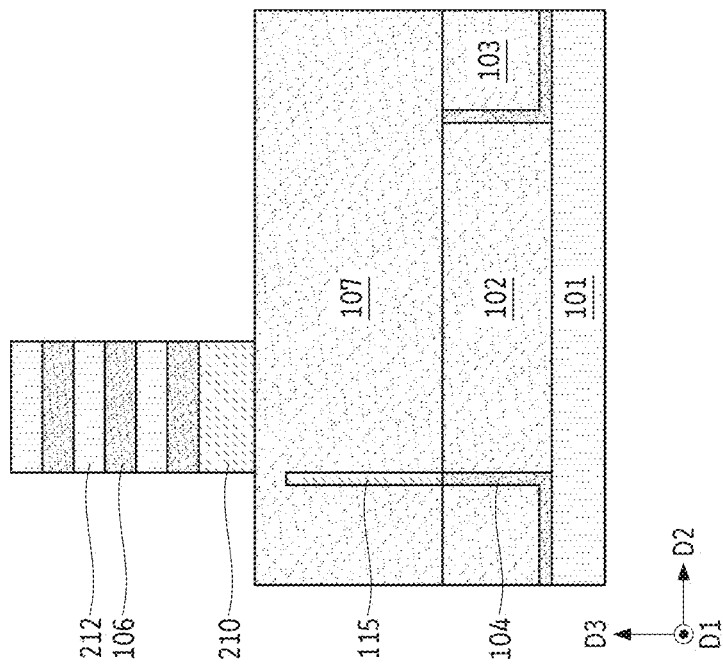

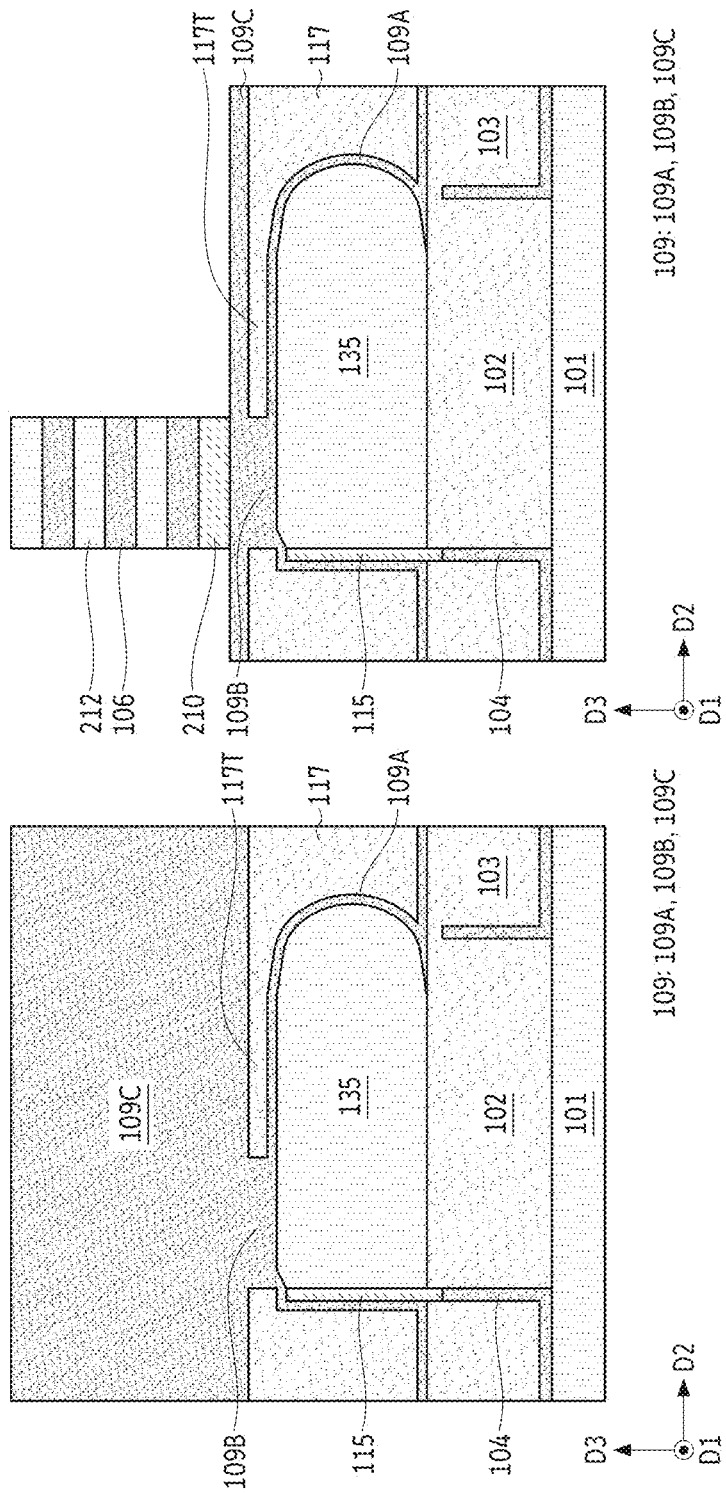

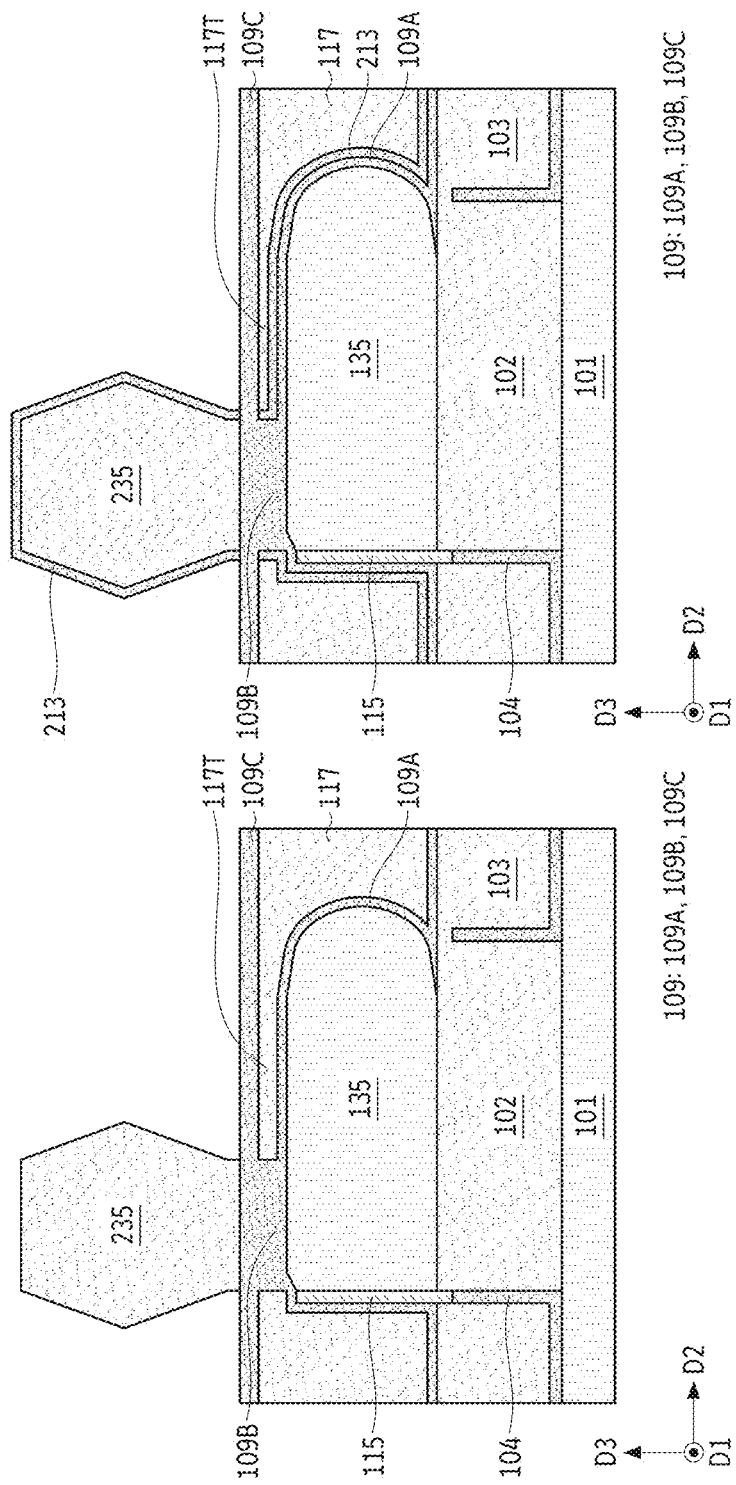

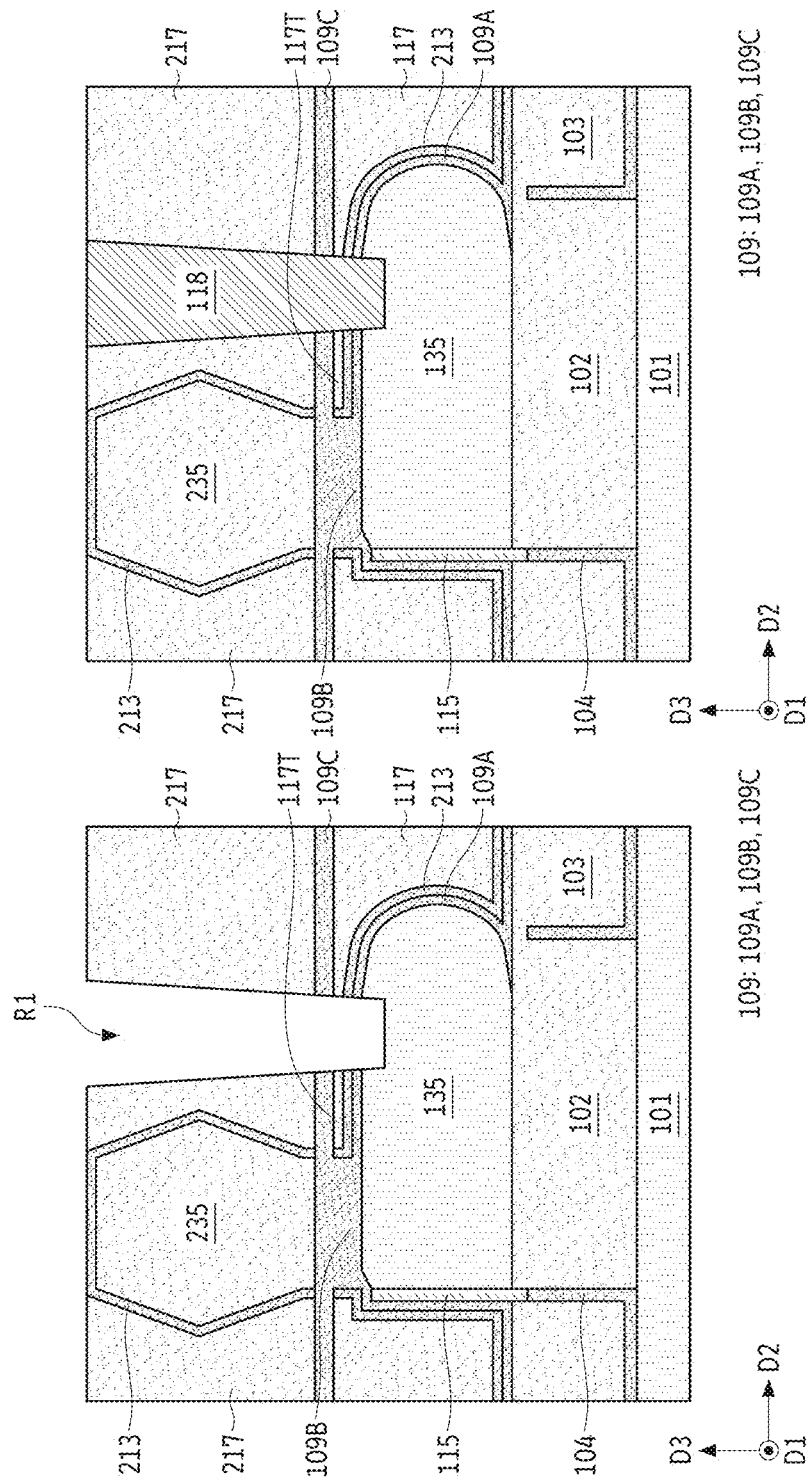

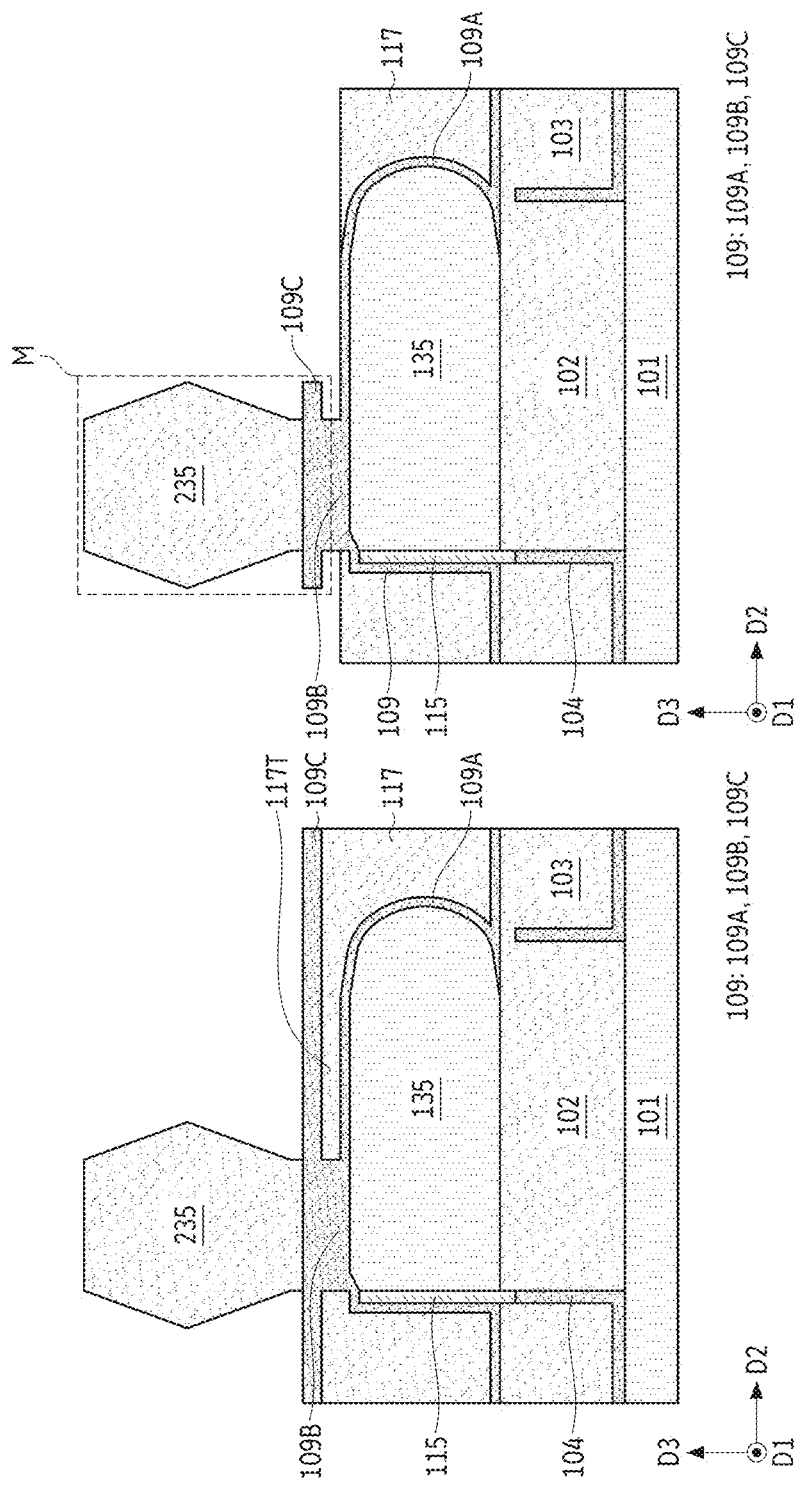

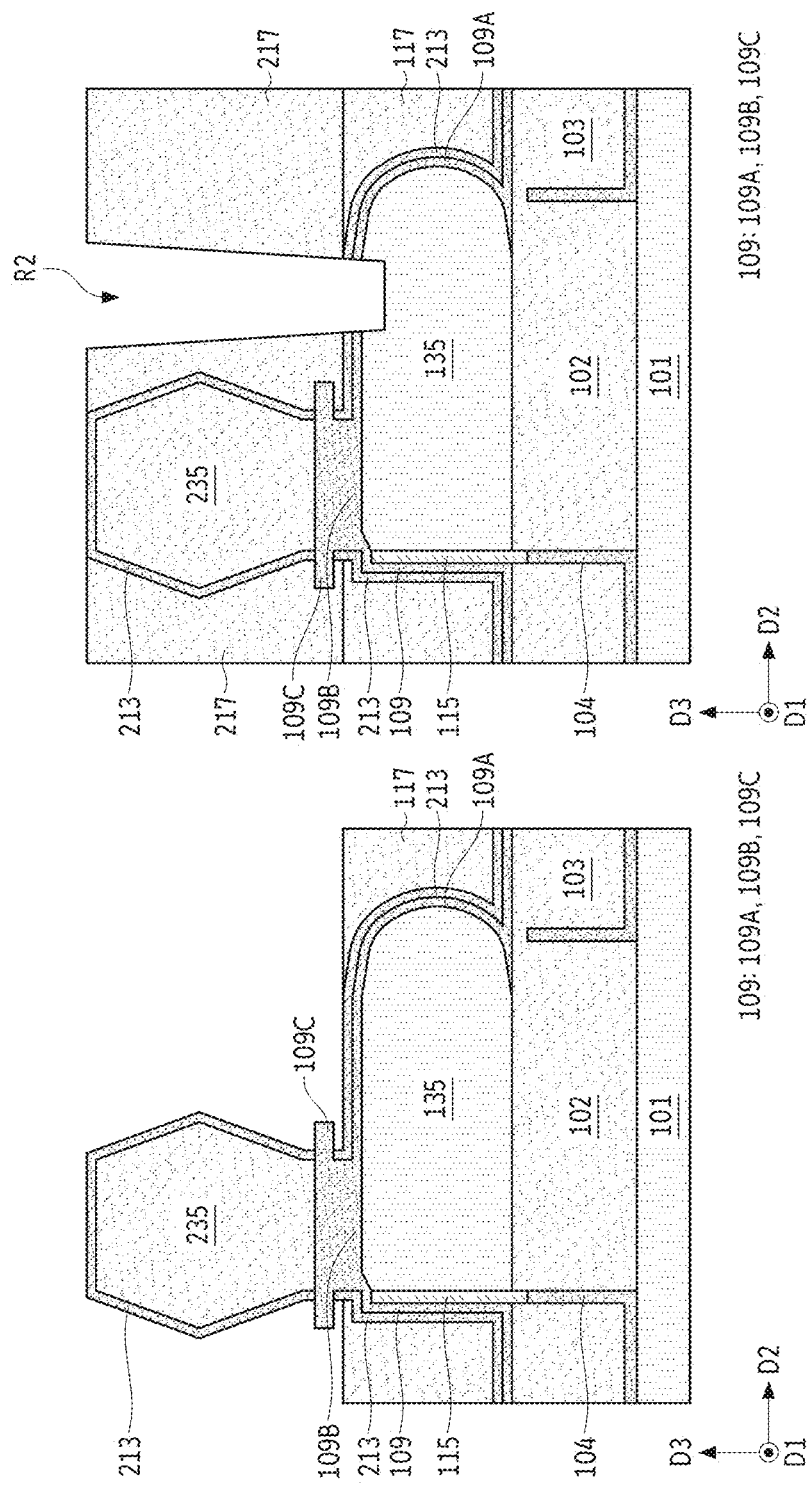

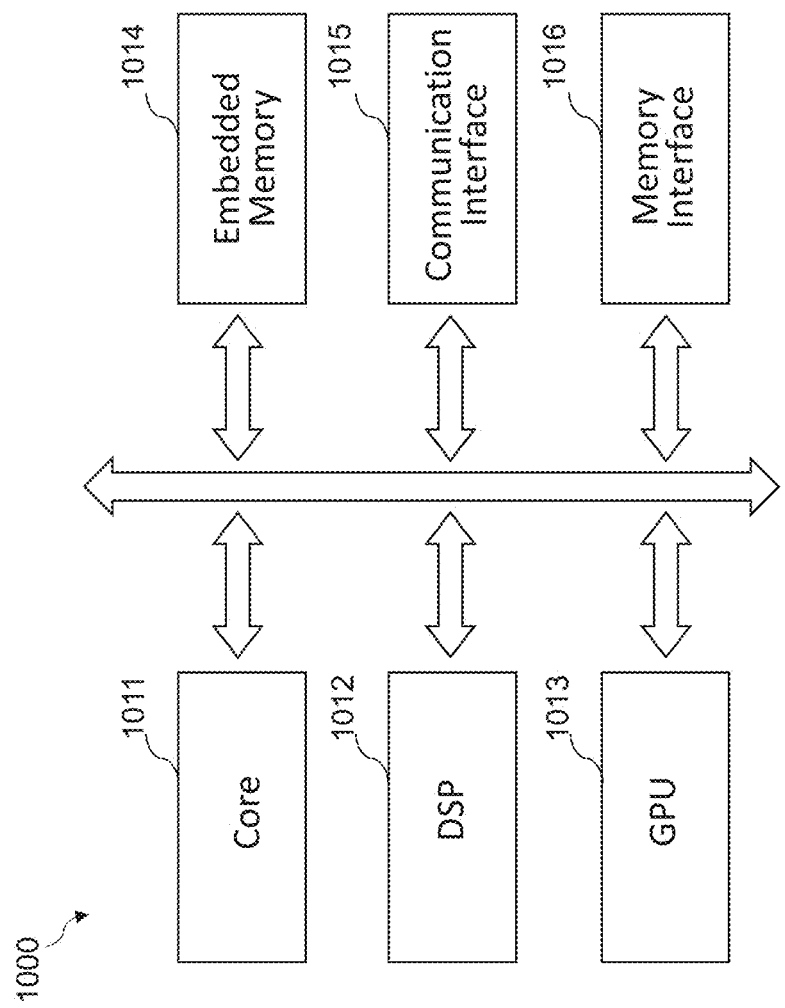

THREE-DIMENSIONAL STACKED SEMICONDUCTOR DEVICE INCLUDING SIMPLIFIED SOURCE/DRAIN CONTACT AREA

CROSS-REFERENCE TO RELATED APPLICATION

This application is based on and claims priority from U.S. Provisional Application No. 63/644,209 filed on May 8, 2024 in the U.S. Patent and Trademark Office, the disclosure of which is incorporated herein in its entirety by reference.

BACKGROUND

1. Field

Apparatuses and methods consistent with the disclosure relate to a three-dimensional stacked (3D-stacked) semiconductor device in which a contact area for a lower source/drain pattern is simplified, and the source/drain pattern is defined by a sidewall spacer.

2. Description of Related Art

A 3D-stacked semiconductor device has been introduced to the semiconductor industry in a response to increased demand for an integrated circuit having a high device density and performance. The 3D-stacked semiconductor device may include a $1^{st}$ transistor structure at a $1^{st}$ level and a $2^{nd}$ transistor structure at a $2^{nd}$ level above the $1^{st}$ level, where each of the two transistor structures may be a fin field-effect transistor (FinFET), a nanosheet transistor, a forksheet transistor, or any other type of transistor.

The FinFET has one or more horizontally arranged vertical fin structures as a channel structure of which at least three surfaces are surrounded by a gate structure, and the nanosheet transistor is characterized by one or more nanosheet channel layers, which are vertically stacked or arranged on a substrate, as a channel structure and a gate structure surrounding all four surfaces of each of the nanosheet channel layers. The nanosheet transistor is referred to as gate-all-around (GAA) transistor, or as a multi-bridge channel field-effect transistor (MBCFET). The forksheet transistor is a combination of two nanosheet transistors with an insulation backbone structure therebetween. Nanosheet channel layers of each nanosheet transistor of the forksheet transistor are formed at each side of the insulation backbone structure and pass through a gate structure in parallel with the backbone structure.

With device density increases to implement the 3D-stacked semiconductor device, an aspect ratio also increases in the formation of channel structures, source/drain patterns, gate structures, and various contact and interconnection structures in the 3D-stacked semiconductor device. Further, a reduced contact-poly-pitch (CPP) and a decreased cell height along with the high aspect ratio present greater challenges in improving performance of the 3D-stacked semiconductor device and a production yield thereof because of a very small process margin, a short-circuit risk, difficulties in forming contact and interconnection structures on source/drain patterns, etc. in the 3D-stacked semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides embodiments of a 3D-stacked semiconductor device in which a lower source/drain pattern has a greater width than an upper source/drain pattern. The 3D-stacked semiconductor device may be formed to include a contact area penetrating a minimum number of different layers including different materials to contact a top surface of a lower source/drain pattern for a lower transistor, thereby simplifying the contact area to facilitate an etching operation through the different layers of the different materials.

The disclosure also provides embodiments of a 3D-stacked semiconductor device in which a lower source/drain pattern has a greater width than an upper source/drain pattern. The 3D-stacked semiconductor device may be formed to include a sidewall spacer on only one side surface of the lower source/drain pattern among two opposite side surfaces thereof, thereby facilitating epitaxial growth of the lower source/drain pattern to increase a non-overlapping region above the lower source/drain pattern wherein the lower source/drain pattern is not vertically overlapped by the upper source/drain pattern.

According to an aspect of the disclosure, there is provided a semiconductor device which may include: a $1^{st}$ channel structure extended in a $1^{st}$ direction; a $2^{nd}$ channel structure extended in the $1^{st}$ direction above the $1^{st}$ channel structure, the $2^{nd}$ channel structure having a smaller width than the $1^{st}$ channel structure in a $2^{nd}$ direction intersecting the $1^{st}$ direction; a $1^{st}$ source/drain pattern on the $1^{st}$ channel structure; a $2^{nd}$ source/drain pattern on the $2^{nd}$ channel structure, the $2^{nd}$ source/drain pattern having a smaller width than the $1^{st}$ source/drain pattern in the $2^{nd}$ direction; a $1^{st}$ liner on the $1^{st}$ source/drain pattern; and a $1^{st}$ isolation layer surrounding the $1^{st}$ source/drain pattern with the $1^{st}$ liner thereon, wherein the $1^{st}$ liner includes a $1^{st}$ portion surrounding an outer surface of the $1^{st}$ source/drain pattern, and a liner portion protruded from the $1^{st}$ portion in a $3^{rd}$ direction intersecting the $1^{st}$ direction and the $2^{nd}$ direction.

According to an aspect of the disclosure, there is provided a semiconductor device which may include: a $1^{st}$ source/drain pattern for a $1^{st}$ transistor; a $2^{nd}$ source/drain pattern for a $2^{nd}$ transistor, above the $1^{st}$ source/drain pattern, the $2^{nd}$ source/drain pattern having a smaller width than the $1^{st}$ source/drain pattern in a channel-width direction; a $1^{st}$ isolation layer surrounding the $1^{st}$ source/drain pattern; a $2^{nd}$ isolation layer surrounding the $2^{nd}$ source/drain pattern, the $1^{st}$ and $2^{nd}$ isolation layers including a first material; a liner surrounding the $1^{st}$ source/drain pattern, the liner including a $2^{nd}$ material; and a contact structure on the $1^{st}$ source/drain pattern, wherein the contact structure penetrates the $2^{nd}$ isolation layer and the liner to contact the $1^{st}$ source/drain pattern without penetrating the $1^{st}$ isolation layer.

According to an aspect of the disclosure, there is provided a semiconductor device which may include: a $1^{st}$ channel structure extended in a $1^{st}$ direction; a $2^{nd}$ channel structure extended in the $1^{st}$ direction above the $1^{st}$ channel structure, the $2^{nd}$ channel structure having a smaller width than the $1^{st}$ channel structure in a $2^{nd}$ direction intersecting the $1^{st}$ direction; a $1^{st}$ source/drain pattern on the $1^{st}$ channel structure; a $2^{nd}$ source/drain pattern on the $2^{nd}$ channel structure, the $2^{nd}$ source/drain pattern having a smaller width than the $1^{st}$ source/drain pattern in the $2^{nd}$ direction; and a sidewall spacer on only one side surface of the $1^{st}$ source/drain pattern among two opposite side surfaces thereof.

According to an aspect of the disclosure, there is provided a method of manufacturing a semiconductor device, which may include: forming a $1^{st}$ channel structure and a $2^{nd}$ channel structure above the $1^{st}$ channel structure such that the $1^{st}$ and $2^{nd}$ channel structures are extended in a $1^{st}$ direction, and the $2^{nd}$ channel structure has a smaller width than the $1^{st}$ channel structure in a $2^{nd}$ direction intersecting the $1^{st}$ direction; forming a $1^{st}$ source/drain pattern on the $1^{st}$ channel structure; forming a $1^{st}$ liner on the $1^{st}$ source/drain pattern; forming a $1^{st}$ isolation layer surrounding the $1^{st}$ source/drain pattern with the $1^{st}$ liner thereon; forming a $2^{nd}$ source/drain pattern on the $2^{nd}$ channel structure; forming a $2^{nd}$ isolation layer surrounding the $2^{nd}$ source/drain pattern; and forming a contact structure such that the contact structure penetrates the $2^{nd}$ isolation layer and the liner to contact the $1^{st}$ source/drain pattern without penetrating the $1^{st}$ isolation layer.

BRIEF DESCRIPTION OF DRAWINGS

Example embodiments of the disclosure will be more clearly understood from the following detailed description taken in conjunction with the accompanying drawings.

FIGS. 3A-3E illustrate cross-section views of intermediate semiconductor devices after respective steps of manufacturing a 3D-stacked semiconductor device having a simplified contact area, according to one or more embodiments.

FIG. 5 is a schematic block diagram illustrating an electronic device including a 3D-stacked semiconductor device having a simplified contact area, according to one or more embodiments.

DETAILED DESCRIPTION

Figure 1:
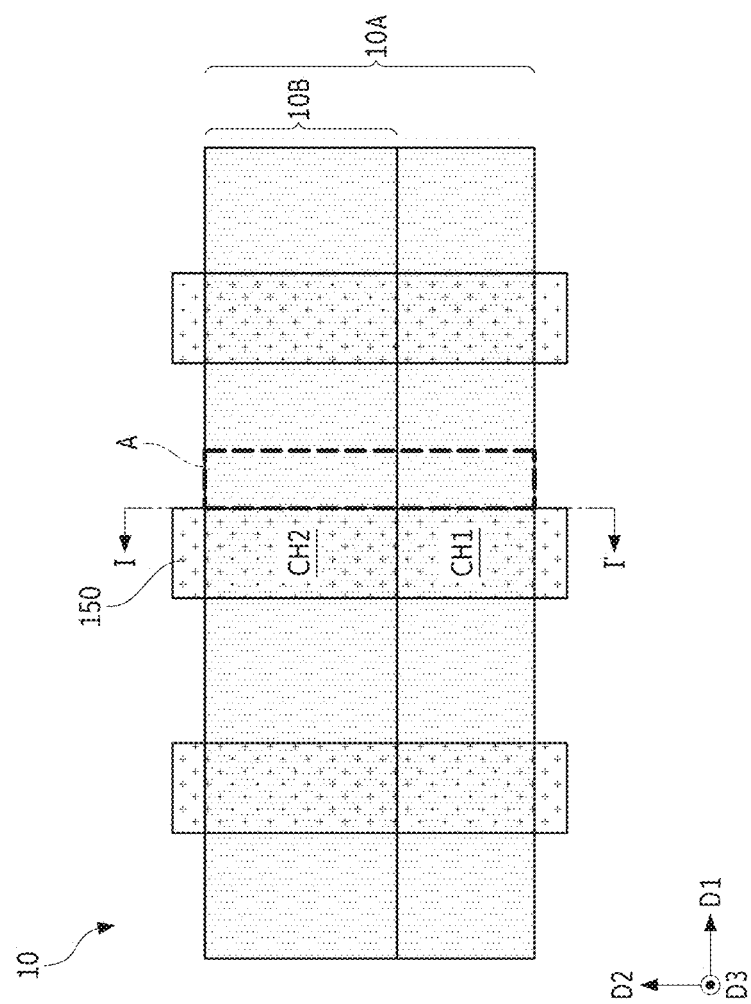
FIG. 1 illustrate a conceptual plan view of an intermediate semiconductor device from which a 3D-stacked semiconductor device is to be manufactured, according to one or more embodiments.

All of the embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element of the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element described in the descriptions of an embodiments could be termed a $2^{nd}$ element in the descriptions of another element or one or more claims, and vice versa without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. Herein, the term "isolation" pertains to electrical insulation or separation between structures, layers, components or regions in a corresponding device or structure.

FIG. 1 illustrate a conceptual plan view of an intermediate semiconductor device from which a 3D-stacked semiconductor device is to be manufactured, according to one or more embodiments, and FIGS. 2A-2N illustrate cross-section views of intermediate semiconductor devices after respective steps of manufacturing a 3D-stacked semiconductor device having a contact area formed of a plurality of different layers, according to one or more embodiments.

Figure 2E:
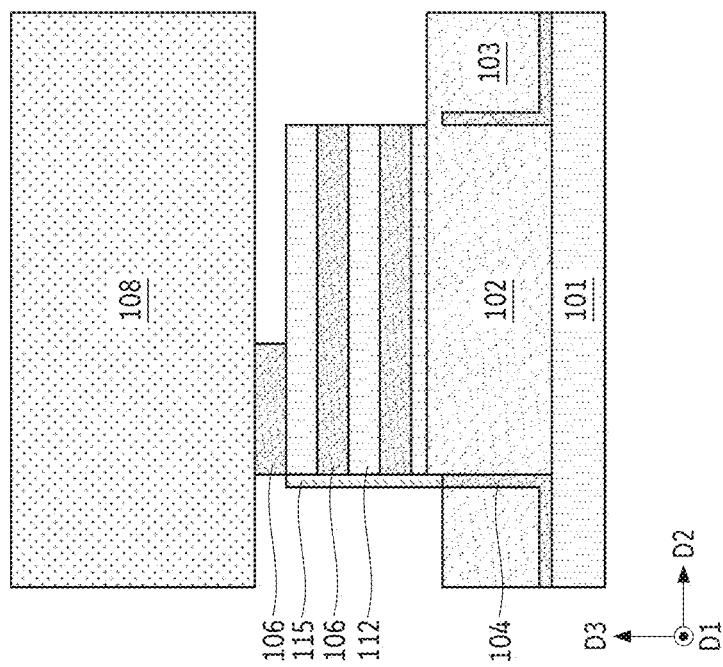
FIGS. 2A-2N illustrate cross-section views of intermediate semiconductor devices after respective steps of manufacturing a 3D-stacked semiconductor device having a contact area formed of a plurality of different layers, according to one or more embodiments.

FIG. 2A is a cross-section view of the intermediate semiconductor device of FIG. 1 taken along a line I-I' shown in FIG. 1, and FIGS. 2B-2N are cross-section views of intermediate semiconductor devices taken in the same direction as the cross-section view of FIG. 2A in an area A shown in FIG. 1 after respective steps are performed on the intermediate semiconductor device of FIG. 2A.

It is to be understood that FIG. 1 is provided to show a positional relationship between active patterns and dummy gate structures, and thus, does not show structural elements such as various other structures or layers shown in FIG. 2A. It is also to be understood that a $1^{st}$ direction D1 is a channel-length direction in which a current flows between two source/drain patterns connected to each other through a channel structure when a 3D-stacked semiconductor device is completed from the intermediate semiconductor devices shown in FIGS. 2A-2N, a $2^{nd}$ direction D2 is a channel-width direction or a cell-height direction that horizontally intersects the $1^{st}$ direction D1, and a $3^{rd}$ direction D3 is a channel-height direction that vertically intersects the $1^{st}$ direction D1 and the $2^{nd}$ direction D2.

Referring to FIGS. 1 and 2A, an intermediate semiconductor device 10 may include a $1^{st}$ active pattern 10A extended in a $1^{st}$ direction D1 and a $2^{nd}$ active pattern 10B also extended in the $1^{st}$ direction D1 above the $1^{st}$ active pattern 10A. The intermediate semiconductor device 10 may also include a plurality of dummy gate structures 150 arranged in the $1^{st}$ direction D1 and extended in a $2^{nd}$ direction D2 intersecting the $1^{st}$ direction D1.

It is to be understood that the line I-I' overlaps a side surface of the dummy gate structure 150 in the $3^{rd}$ direction D3 in FIG. 1.

In the intermediate semiconductor device 10 as shown in FIG. 1, the $2^{nd}$ active pattern 10B may be formed above the $1^{st}$ active pattern 10A in the $3^{rd}$ direction D3, and may have a smaller width than the $1^{st}$ active pattern 10A in the $2^{nd}$ direction D2. Thus, an area of the $1^{st}$ active pattern 10A which is not overlapped by the $2^{nd}$ active pattern 10B in the $3^{rd}$ direction D3 may be shown in the plan view of FIG. 1.

Further, in the intermediate semiconductor device 10, a portion of the $1^{st}$ active pattern 10A surrounded by each of the dummy gate structures 150 may refer to a $1^{st}$ channel structure CH1, and a portion of the $2^{nd}$ active pattern 10B surrounded by each of the dummy gate structures 150 may refer to a $2^{nd}$ channel structure CH2. Thus, like the $2^{nd}$ active pattern 10B formed above the $1^{st}$ active pattern 10A, the $2^{nd}$ channel structure CH2 may also be formed above the $1^{st}$ channel structure CH2 in the $3^{rd}$ direction D3, and may have a smaller width than the $1^{st}$ channel structure CH1.

The $1^{st}$ channel structure CH1 is to form a lower nanosheet transistor of a 3D-stacked semiconductor device when $1^{st}$ source/drain patterns are formed on the $1^{st}$ channel structure CH1 and a dummy gate structure 150 surrounding the $1^{st}$ channel structure CH1 is replaced by a gate structure. Similarly, the $2^{nd}$ channel structure CH2 is to form an upper nanosheet transistor of the 3D-stacked semiconductor device when $2^{nd}$ source/drain patterns are formed on the $2^{nd}$ channel structure CH2 and a dummy gate structure 150 surrounding the $2^{nd}$ channel structure CH2 is replaced by a gate structure. For example, the $1^{st}$ channel structure CH1 and the $2^{nd}$ channel structure CH2 may be surrounded by the same dummy gate structure to be replaced by a single common gate structure to form a complementary metal-oxide-semiconductor (CMOS) device in a 3D form.

Each of the channel structures CH1 and CH2 may include a plurality of semiconductor layers epitaxially grown based on the substrate 101 which may be a silicon (Si) substrate, as shown in FIG. 2A. The substrate 101 may additionally or alternatively include other materials such as silicon germanium (SiGe), silicon carbide (SiC), not being limited thereto. Some of the semiconductor layers forming the $1^{st}$ channel structure CH1 may include $1^{st}$ sacrificial layers 111 formed of silicon germanium (SiGe) and $1^{st}$ channel layers 112 formed of silicon (Si) which are alternately stacked on the substrate 101. The other semiconductor layers forming the $2^{nd}$ channel structure CH2 may include a middle sacrificial layer 209, a middle isolation layer 210, and further, $2^{nd}$ sacrificial layers 211 formed of SiGe and the $2^{nd}$ channel layers 212 formed of Si which are also alternately stacked on the middle isolation layer 210.

The middle isolation layer 210 may be formed to isolate the $1^{st}$ channel structure CH1 and the $2^{nd}$ channel structure CH2, and may include silicon nitride or a composite thereof, for example, SiN, $Si_3N_4$, SiBCN, SiCN, SiOC, SiOCN, etc., not being limited thereto.

The $1^{st}$ channel structure CH1 and the $2^{nd}$ channel structure CH2 thereabove may be formed by patterning an initial channel structure including the plurality of semiconductor layers such that the $2^{nd}$ channel structure CH2 has a smaller width than the $1^{st}$ channel structure CH1 in the $2^{nd}$ direction D2. Thus, the semiconductor layers forming the $2^{nd}$ channel structure CH2 may have a same smaller width than the semiconductor layers forming the 1t channel structure CH1. For example, while a $1^{st}$ side surface S21 of the $2^{nd}$ channel structure CH2 may be aligned or coplanar with a $1^{st}$ side surface S11 of the $1^{st}$ channel structure CH1 in the $3^{rd}$ direction D3, a $2^{nd}$ side surface S22, opposite to the $1^{st}$ side surface S21, of the $2^{nd}$ channel structure CH2 may not be aligned or coplanar with a $2^{nd}$ side surface S12, opposite to the $2^{nd}$ side surface S11, of the $1^{st}$ channel structure CH1 in the $3^{rd}$ direction D3. Instead, the $2^{nd}$ side surface S22 of the $2^{nd}$ channel structure CH1 may overlap a point on a top surface of the $1^{st}$ channel structure CH1 between two side edges of thereof in the $2^{nd}$ direction D2. Here, the side surfaces S11, S12, S21 and S22 refer to side surfaces in the cross-section view in the $2^{nd}$ direction D2 as shown in FIG. 2A.

Formation of the channel structures CH1 and CH2 in the above-described manner is intended to form a $2^{nd}$ source/drain pattern to be grown from the $2^{nd}$ channel structure CH2 to have a smaller width than a $1^{st}$ source/drain pattern to be grown from the $1^{st}$ channel structure CH1 in a later step, so that a contact structure for the $1^{st}$ source/drain pattern can be formed on a top surface of the $1^{st}$ source/drain pattern through a non-overlapping region where the $1^{st}$ source/drain pattern is not overlapped by the smaller-width $2^{nd}$ source/drain pattern in the $3^{rd}$ direction D3. This will be further described later.

In the meantime, the intermediate semiconductor device 10 may also include a sidewall spacer 115 formed at the $1^{st}$ side surface S11 of the $1^{st}$ channel structure CH1 which is aligned or coplanar with the $1^{st}$ side surface S21 of the $2^{nd}$ channel structure CH2 in the $3^{rd}$ direction. The sidewall spacer 115 may be a residual layer of a gate spacer which is formed at a side surface of the dummy gate structure 150 and remains after the initial channel structure is patterned to form the $1^{st}$ channel structure CH1 and the smaller-width $2^{nd}$ channel structure CH2. As also will be described later, this sidewall spacer 115 may extend in the $1^{st}$ direction D1 beyond the channel structure CH1 to suppress growth of the $1^{st}$ source/drain pattern from the $1^{st}$ channel structure CH1 in the $2^{nd}$ direction D2 towards the sidewall spacer 115, hereafter referred to as D2-direction. However, the residual layer of the gate spacer may not remain on a $2^{nd}$ side surface S12 of the $1^{st}$ channel structure CH1, opposite to the $1^{st}$ side surface S11 in the $2^{nd}$ direction D2. Thus, while the $1^{st}$ source/drain pattern is generally grown from the $1^{st}$ channel structure CH1 in the $1^{st}$ direction D1, the $1^{st}$ source/drain pattern may also be grown sufficiently in the D2 direction opposite to the direction of the sidewall spacer 115, hereafter referred to as D2+direction, at least because no sidewall spacer is formed on the $2^{nd}$ side surface S12 of the $1^{st}$ channel structure CH1.

Herein, the $1^{st}$ direction D1 perpendicularly coming out of the paper is referred to as D1+direction, and the $1^{st}$ direction D1 perpendicularly going into the paper is referred to as D1-direction. The sidewall spacer 115 may be formed of a material such as silicon nitride or a composite thereof (e.g., SiN, $Si_3N_4$, SiBCN, SiCN, SiOC, SiOCN, etc.), not being limited thereto, which may be the same as or different from the material forming the middle isolation layer 210.

The substrate 101 may include an active region which takes a protruded form, and on which the $1^{st}$ channel structure CH1 is formed. As each side of the active region in the $2^{nd}$ direction D2 may be formed a shallow trench isolation (STI) structure 103 isolating the active region from an active region of another semiconductor device. The STI structure 103 may be formed of a low-k dielectric material such as silicon oxide (e.g., $SiO_2$), not being limited thereto.

Between the STI structure 103 and the substrate 101 may be formed an STI liner 104 preventing oxidation of the substrate 101 by the formation of the STI structure 103. The STI liner 104 may be formed of a material such as silicon nitride (e.g., SiN, $Si_3N_4$, SiBCN, SiCN, SiOC, SiOCN, etc.), not being limited thereto.

Referring to FIGS. 1 and 2B, portions of the active patterns 10A and 10B between the dummy gate structures 150 may be patterned in the $3^{rd}$ direction D3 to expose the substrate 101, and inner spacers 106 may be formed on the sacrificial layers 111, 209 and 211, respectively.

For example, a portion of the active patterns 10A and 10B shown in the plan view of FIG. 1 between the two adjacent dummy gate structures 150 may be patterned in the $3^{rd}$ direction. The patterning of the active patterns 10A and 10B in this step may provide spaces to form a $1^{st}$ source/drain pattern between the $1^{st}$ channel structures CH1 and a $2^{nd}$ source/drain pattern between the $2^{nd}$ channel structures CH2 in later steps. By this patterning operation, the active patterns 10A and 10B may remain only as the channel structures CH1 and CH2 below the dummy gate structures 150. The patterning operation may be performed through, for example, dry etching such as reactive ion etching (RIE).

The patterning of the active patterns 10A and 10B in this step may extend into the substrate 101 to form a recess having a predetermined depth which may be substantially the same as a height of the active region of the substrate 101, and a bottom isolation structure 102 may be formed in the recess formed in the substrate 101. The bottom isolation structure 102 may prevent current leakage from the $1^{st}$ source/drain pattern to be formed thereabove in a later step when a 3D-stacked semiconductor device formed from the intermediate semiconductor device 10 functions.

After the active patterns 10A and 10B are patterned, the inner spacers 106 may be formed by etching a surface of each of the sacrificial layers 111, 209 and 211 to form a recess and filling the recess with an isolation material such as silicon nitride or a composite thereof (e.g., SiN, $Si_3N_4$, SiBCN, SiCN, SiOC, SiOCN, etc.), not being limited thereto. Here, the surface of each of the sacrificial layers 111, 209 and 211 where the recess is formed refers to a front surface thereof in the cross-section view in the $2^{nd}$ direction D2 as shown in FIG. 2A. This front surface of each of the sacrificial layers 111, 209 and 211 refers to a side surface thereof in the cross-section view in the $1^{st}$ direction D1.

The inner spacers 106 may be formed on the surfaces of the sacrificial layers 111, 209 and 211 of SiGe to block these sacrificial layers when the $1^{st}$ source/drain patterns and the $2^{nd}$ source/drain patterns are epitaxially grown from the channel layers 112 and 212, respectively, in later steps. The inner spacers 106 may also isolate the $1^{st}$ and $2^{nd}$ source/drain patterns from a gate structure which will replace the sacrificial layers 111, 209 and 211 and the dummy gate structure 150 in a later step.

Referring to FIG. 2C, a passivation structure 107 may be formed in a space between two adjacent $1^{st}$ channel structures CH1 obtained by the patterning of the active patterns 10A and 10B in the previous step (FIG. 2B).

The passivation structure 107 may be a spin-on-glass (SOG) including an oxide material such as silicon oxide (e.g., $SiO_2$). The passivation structure 107 may be formed to protect the $1^{st}$ channel structures CH1 from an operation of forming a blocking liner on a surface of each of the $1^{st}$ channel structures CH1 in a next step. The passivation structure 107 may also be formed between the inner spacers 106 on the middle sacrificial layers 209 in the $1^{st}$ direction D1 to sufficiently cover the $1^{st}$ channel structure CH1 therebelow from the subsequent operation in the next step. Thus, the middle sacrificial layer 209 is not seen in FIG. 2C.

At this time, the sidewall spacer 115 on the $1^{st}$ side surface S11 of the $1^{st}$ channel structure CH11 may still be shown in FIG. 2C because the sidewall spacer 115 is extended in the $1^{st}$ direction D1 beyond the channel structure CH1 as described above in reference to FIG. 2A.

Referring to FIG. 2D, a blocking liner 108 may be formed on a front surface of the $2^{nd}$ channel structure CH2, which is a side surface thereof in the cross-section view in the $1^{st}$ direction D1.

The blocking liner 108 may be formed on the $2^{nd}$ channel structure CH2 to protect the $2^{nd}$ channel structure CH2 during formation of a $1^{st}$ source/drain pattern from the $1^{st}$ channel structure CH1 in a later step. The blocking liner 108 may be formed by depositing an isolation material such as silicon nitride or a composite thereof (e.g., SiN, $Si_3N_4$, SiBCN, SiCN, SiOC, SiOCN, etc.) through, for example, atomic layer deposition (ALD). The blocking liner 108 is referred to as such because, in the cross-section view in the $1^{st}$ direction D1, the blocking liner 108 may be viewed as a liner formed on side surfaces of the $2^{nd}$ channel layers 212, the inner spacers 106 on the $2^{nd}$ sacrificial layers 211 and the middle isolation layer 210 of the $2^{nd}$ channel structure.

Referring to FIG. 2E, the passivation structure 107 may be removed to expose the surface of the $1^{st}$ channel structure CH1 including the $1^{st}$ channel layers 112 from which a $1^{st}$ source/drain pattern is to be epitaxially grown in a next step.

The removal of the passivation structure 107 may expose the $1^{st}$ channel structure CH1 including the $1^{st}$ channel layers 112 and the inner spacers 106 formed on the surfaces of the $1^{st}$ sacrificial layers 111 in the D1 direction. Further, the inner spacer 106 on the middle sacrificial layer 209 of the $2^{nd}$ channel structure CH2 may be exposed in the D1 direction.

The removal of the passivation structure 107 may be performed through, for example, ashing, stripping or dry and/or wet etching, not being limited thereto.

Figure 2F:
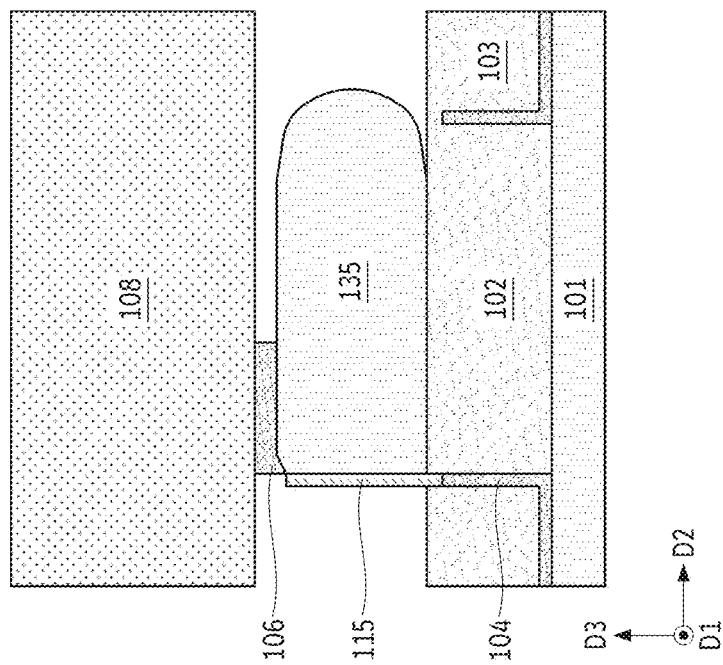

Referring to FIG. 2F, a $1^{st}$ source/drain pattern 135 may be formed based on the $1^{st}$ channel layers 112 of the $1^{st}$ channel structure CH1 exposed in the previous step (FIG. 2E) while the $2^{nd}$ channel layers 212 of the $2^{nd}$ channel structure CH2 are blocked by the blocking liner 108 formed in the previous step (FIG. 2D) and the $1^{st}$ sacrificial layers 111 of the $1^{st}$ channel structure CH2 are blocked by the inner spacers 106.

The $1^{st}$ source/drain pattern 135 may be epitaxially grown from the $1^{st}$ channel layers 112 through, for example, molecular beam epitaxy (MBE), vapor-phase epitaxy (VPE), etc., not being limited thereto. The $1^{st}$ source/drain pattern 135 may be formed of silicon (Si) and may be doped in-situ with impurities such as phosphorus (P), arsenic (As), antimony (Sb), etc., so that the $1^{st}$ source/drain pattern 135 can be of an n-type. Alternatively, the $1^{st}$ source/drain pattern 135 may be formed of silicon germanium (SiGe) and may be doped in-situ with impurities such as boron (B), gallium (Ga), indium (In), etc., so that the $1^{st}$ source/drain pattern 135 can be of a p-type.

The $1^{st}$ source/drain pattern 135 may grow isotropically from the exposed surface of the $1^{st}$ channel layers 112. However, due to the sidewall spacer 115 formed on the $1^{st}$ side surface S11 of the $1^{st}$ channel structure CH1 and extended in the D1+direction, epitaxial growth of the $1^{st}$ source/drain pattern 135 in the D2-direction may stop at the sidewall spacer 115, while epitaxial growth thereof in the D2+direction may result in formation of a sufficient amount of the $1^{st}$ source/drain pattern 135 to provide an increased non-overlapping region above the $1^{st}$ source/drain pattern 135, thereby facilitation formation of a contact structure on the top surface of the $1^{st}$ source/drain pattern 135. For example, a left side surface of the $1^{st}$ source/drain pattern 135 may be flat or substantially flat and horizontally coplanar or aligned with the $1^{st}$ side surface S11 of the $1^{st}$ channel structure CH1 in the $1^{st}$ direction D1, while a right side surface of the $1^{st}$ source/drain pattern 135 may not be flat or substantially flat and may extend beyond the $2^{nd}$ side surface S12 of the $1^{st}$ channel structure CH1, in the cross-section view in the $2^{nd}$ direction D2 (FIG. 2F). Thus, a non-overlapping region above a top surface of the $1^{st}$ source/drain pattern 135, where the $1^{st}$ source/drain pattern 135 is not overlapped, in the $3^{rd}$ direction D3, by a $2^{nd}$ source/drain pattern to be formed in a later step, may be enlarged to facilitate formation of a contact structure on the top surface of the $1^{st}$ source/drain pattern 135 through the non-overlapping region.

Figure 2H:
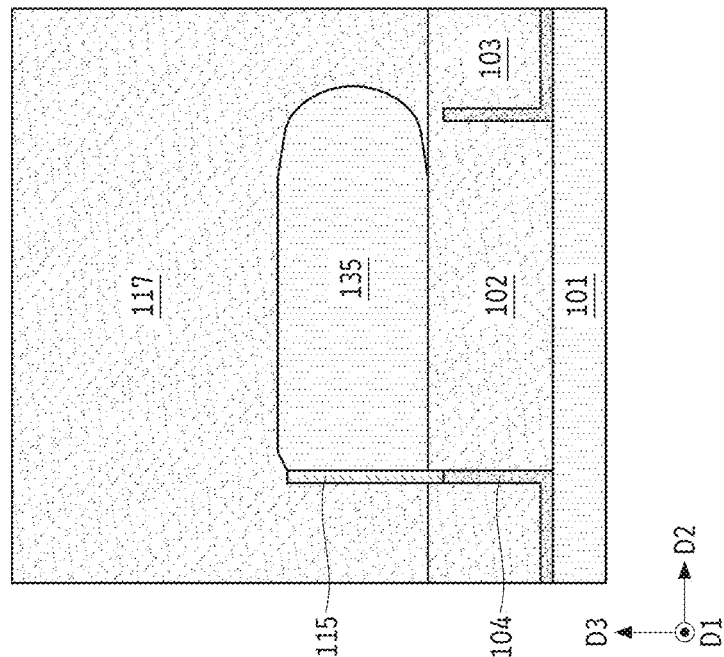
Figure 2G:
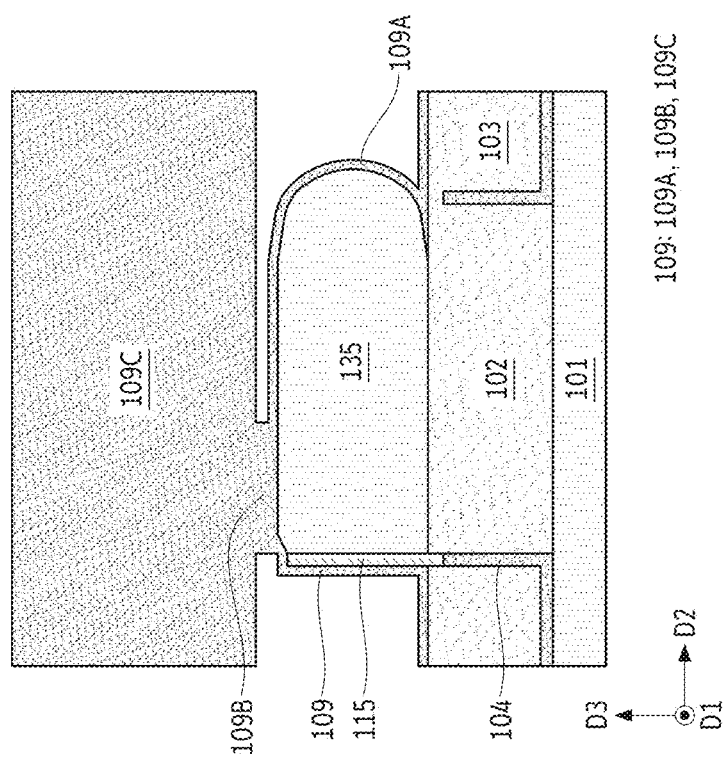

Referring to FIG. 2G, a $1^{st}$ liner 109 may be formed on the $1^{st}$ source/drain pattern 135, the inner spacer 106 on the middle sacrificial layer 209, and the blocking liner 108.

The $1^{st}$ liner 109, also referred to as inter-device interlayer dielectric (iILD) liner, may include a $1^{st}$ portion 109A, a $2^{nd}$ portion 109B and a $3^{rd}$ portion 109C. The $1^{st}$ portion 109A of the $1^{st}$ liner 109 may surround the $1^{st}$ source/drain pattern 135 through, for example, ALD, not being limited thereto so that the $1^{st}$ source/drain pattern 135 can be protected from oxidation by an oxide material such as silicon oxide (e.g., $SiO_2$) forming a $1^{st}$ isolation layer in a later step. The $2^{nd}$ portion 109B and the $3^{rd}$ portion 109C of the $1^{st}$ liner 109 may be formed on a front surface of the inner spacer 106 on the middle sacrificial layer 209 and a front surface of the blocking liner 108, respectively, in the cross-section view in the $2^{nd}$ direction D2 (FIG. 2G). The $2^{nd}$ portion 109B may connect the $1^{st}$ portion 109A and the $3^{rd}$ portion 109C.

When the $1^{st}$ portion of the $1^{st}$ liner 109 is formed to surround the $1^{st}$ source/drain pattern 135, the $1^{st}$ portion of the $1^{st}$ liner 109 may be formed on the sidewall spacer 115 on the left side surface of the $1^{st}$ source/drain pattern 135.

The $1^{st}$ liner 109 may be formed of nitride or a composite thereof (e.g., SiN, $Si_3N_4$, SiBCN, SiCN, SiOC, SiOCN, etc.), not being limited thereto.

Referring to FIG. 2H, a $1^{st}$ isolation layer 117 may be formed on the $1^{st}$ liner 109.

The $1^{st}$ isolation layer 117 may be formed to isolate the $1^{st}$ source/drain pattern 135 from other circuit elements including a $2^{nd}$ source/drain pattern to be grown from the $2^{nd}$ channel structure CH2 in a later step. Thus, the $1^{st}$ isolation layer 117 may be referred to as inter-device interlayer dielectric (iILD) layer.

The $1^{st}$ isolation layer 117 may be formed by depositing a low-k material such as silicon oxide (e.g., $SiO_2$) through, for example, physical vapor deposition (PVD), chemical vapor deposition (CVD), plasma enhanced chemical vapor deposition (PECVD), or a combination thereof, not being limited thereto.

Referring to FIG. 2I, the $1^{st}$ isolation layer 117 may be partially removed to leave the $1^{st}$ isolation layer 117 only below a level of a bottom surface of the middle isolation layer 210 (shown in FIG. 2C).

The $1^{st}$ isolation layer 117 may be etched down in the $3^{rd}$ direction D3 at least to a level below a bottom surface of the lowermost $2^{nd}$ channel layer 212 so that, in a subsequent step, the $1^{st}$ liner 109 and the blocking liner 108 below the removed $1^{st}$ isolation layer 117 can be removed. However, the $1^{st}$ isolation layer 117 may be required to remain by a minimum height above the $1^{st}$ source/drain pattern 135 to isolate the 1st source/drain pattern 135 from other circuit elements including a 2nd source/drain pattern to be grown from the 2nd channel structure CH2 in a later step. Thus, a gap portion 117T of the 1st isolation layer 117 may be disposed between the 1st portion 109A of the 1st liner 109 on an outer surface, including a top surface, of the 1st source/drain pattern 135 and the 3rd portion 109C of the 1st liner 109 on the 2nd channel structure CH2 with the blocking liner 108 therebetween. For example, as shown in FIG. 2I, the gap portion 117T of the 1st isolation layer 117 may be sandwiched between the 1st portion 10A and the 3rd portion 109C of the 1st liner 109.

The partial removal of the 1st isolation layer 117 may be performed through, for example, dry etching, not being limited thereto.

Referring to FIG. 2J, the 3rd portion 109C of the 1st liner 109 on the blocking liner 108 may be partially removed to leave only a liner portion extended in the D2 direction with the gap portion 117T of the 1st isolation layer 117 therebelow.

When the 3rd portion 109C of the 1st liner 109 on the blocking liner 108 is partially removed, the blocking liner 108 formed therebelow in the 1st direction D1 may also be removed to expose the 2nd channel structure CH2 so that the 2nd channel layers 212 can be open for epitaxial growth of a 2nd source/drain pattern therefrom in a next step.

However, because of the minimum height of the 1st isolation layer 117 required above the top surface of the 1st source/drain pattern 135, a lower part of the 3rd portion 109C of the 1st liner 109 may remain in a form of a necking liner, herein referred to as a liner portion 109C, extended in the 2nd direction D2 beyond a level of the left side surface of the 1st source/drain pattern 135 and a level of the right side surface thereof. Thus, the liner portion 109C has a left part and a right part which do not overlap the 1st source/drain pattern 135.

Further, the liner portion 109C along with the 2nd portion 109B may take a form which is protruded from the 1st portion 109A in the 3rd direction D3 at an overlapping region where the 1st source/drain pattern 135 is overlapped by a 2nd source/drain pattern to be grown from the 2nd channel structure CH2 in a next step.

Referring to FIG. 2K, a 2nd source/drain pattern 235 may be formed based on the 2nd channel layers 212 of the 2nd channel structure CH2 exposed in the previous step (FIG. 2J) while the 2nd sacrificial layers 211 are blocked by the inner spacers 106.

The 2nd source/drain pattern 235 may be epitaxially grown from the 2nd channel layers 212 through, for example, molecular beam epitaxy (MBE), vapor-phase epitaxy (VPE), etc., not being limited thereto. The 2nd source/drain pattern 235 may be formed of silicon (Si) and may be doped in-situ with impurities such as phosphorus (P), arsenic (As), antimony (Sb), etc., so that the 1st source/drain pattern 235 can be of an n-type. Alternatively, the 2nd source/drain pattern 235 may be formed of silicon germanium (SiGe) and may be doped in-situ with impurities such as boron (B), gallium (Ga), indium (In), etc., so that the 2nd source/drain pattern 235 can be of a p-type.

As described earlier, the 2nd source/drain pattern 235 may have a smaller width than the 1st source/drain pattern 135 because the 2nd channel layers 212 have a smaller width than the 1st channel layers 112 so that the non-overlapping region, where the 1st source/drain pattern 135 is not overlapped by the 2nd source/drain pattern 235 in the 3rd direction D3, can be provided on the top surface of the 1st source/drain pattern 135.

Referring to FIG. 2L, a 2nd liner 213 may be formed on an outer surface of the 2nd source/drain pattern and the 1st portion 109A of the 1st liner 109.

The 2nd liner 213 may be formed to prevent the 2nd source/drain pattern 235 from being oxidized by a 2nd isolation layer to be formed around the 2nd source/drain pattern 235 in a next step.

When the 2nd liner 213 is formed on the outer surface of the 2nd source/drain pattern 235, the 2nd liner 213 may also be formed to surround the 1st source/drain pattern with the 1st portion 109A of the 1st liner 109 thereon. Thus, the outer surface of the 1st source/drain pattern 135 may be surrounded by two liners, that is, the 1st liner 109 (1st portion 109A) and the 2nd liner 213.

The formation of the 2nd liner 213 may be performed by depositing a nitride material such as silicon nitride or a composite thereof (e.g., SiN, $Si_3N_4$, SiBCN, SiCN, SiOC, SiOCN, etc.) through, for example, atomic layer deposition (ALD), not being limited thereto. The 2nd liner 213 may be formed of the same material of the 1st liner 109. Thus, after formation of the 2nd liner 213 on the 1st liner 109 (1st portion 109A), the two liners 213 and 109 may form a single liner on the outer surface of the 1st source/drain pattern 135.

Referring to FIG. 2M, a 2nd isolation layer 217 may be formed to surround the 2nd source/drain pattern 235 with the 2nd liner 213 thereon, and a portion of the 2nd isolation layer 217 above the top surface of the 1st source/drain pattern 135 may be patterned to form a recess R1 which exposes the 1st source/drain pattern 135.

The 2nd isolation layer 217 may be formed to isolate the 2nd source/drain pattern 235 from other circuit elements including the 1st source/drain pattern 135. A low-k dielectric material which may be the same as the low-k dielectric material forming the 1st isolation layer 117 may be formed through, for example, PVD, CVD, PECVD, or a combination thereof, not being limited thereto, followed by planarization on top.

Next, the recess R1, in which a contact structure is to be formed to contact the 1st source/drain pattern 135, for example, the top surface thereof, in a next step, may be formed in the non-overlapping region where the 1st source/drain pattern 135 is not overlapped by the 2nd source/drain pattern 235 in the 3rd direction D3. For example, in the non-overlapping region, the recess R1 may penetrate through the 2nd isolation layer 217, the liner portion 109C of the 1st liner 109, the gap portion 117T of the 1st isolation layer 117, the 2nd liner 213, and the 1st portion 109A of the 1st liner 109 to contact the 1st source/drain pattern 135. The formation of the recess R1 may be performed through, for example, dry etching and/or wet etching, not being limited thereto.

Referring to FIG. 2N, a contact structure 118 may be formed in the recess R1 to contact the 1st source/drain pattern 135.

The contact structure 118 may connect the 1st source/drain pattern 135 to a voltage source or another circuit element for signal routing. The contact structure 118 may be formed of copper (Cu), tungsten (W), aluminum (Al), ruthenium (Ru), molybdenum (Mo), etc., not being limited thereto.

However, referring back to FIG. 2M, the formation of the recess R1 in the non-overlapping region to reach the 1st source/drain pattern 135 is challenging because an etching operation should be performed across six different layers including different materials having different etch selectivities. For example, the recess R1 may have to penetrate the 2nd isolation layer 217, the liner portion 109C of the 1st liner 109, the gap portion 117T of the 1st isolation layer 117, the $2^{nd}$ liner 213, and the $1^{st}$ portion 109A of the $1^{st}$ liner 109. In this embodiment, an etching operation penetrating one layer (e.g., the liner portion 109C of the $1^{st}$ liner 109 formed of silicon nitride may stop at or may not timely penetrate through the gap portion 117T of the $1^{st}$ isolation layer 117.

The following embodiments may address the foregoing problems and any other unknown problems in forming a contact structure on the $1^{st}$ source/drain pattern 135 of a 3D-stacked semiconductor device.

FIGS. 3A-3E illustrate cross-section views of intermediate semiconductor devices after respective steps of manufacturing a 3D-stacked semiconductor device having a simplified contact area, according to one or more embodiments.

Initial steps of manufacturing a 3D-stacked semiconductor device having a simplified contact area may be the same as or similar to those described above for manufacturing a 3D-stacked semiconductor device having a contact area formed of a plurality of different layers in reference to FIGS. 2A-2N. For example, the intermediate semiconductor device shown in FIG. 3A may be the same as that shown in FIG. 2K, and thus, descriptions thereof are omitted herein.

Referring to FIG. 3B, the $2^{nd}$ source/drain pattern 235 and a part of the liner portion 109C of the $1^{st}$ liner 109 below the $2^{nd}$ source/drain pattern 235 may be masked, and the $1^{st}$ isolation layer 117 and the remaining part of the liner portion 109C may be partially removed based on the masking.

The masking may be performed through, for example, photolithography and hard-masking operations on a region M shown in FIG. 3B. Based on this masking, parts of the liner portion 109C and the gap portion 117T of the $1^{st}$ isolation layer 117 outside the region M in the $2^{nd}$ direction D1 above the $1^{st}$ source/drain pattern 135 may be removed. After the partial removal operation in this step, a part of the liner portion 109C overlapping the $1^{st}$ source/drain pattern 135 and the $2^{nd}$ source/drain pattern 235 may remain. The removal operation in this step may be performed through, for example, dry etching and/or wet etching.

Referring to FIG. 3C, a $2^{nd}$ liner 213 may be formed on an outer surface of the $2^{nd}$ source/drain pattern and the $1^{st}$ portion 109A of the $1^{st}$ liner 109A.

The $2^{nd}$ liner 213 may be formed to prevent the $2^{nd}$ source/drain pattern 235 from being oxidized by a $2^{nd}$ isolation layer to be formed around the $2^{nd}$ source/drain pattern 235 in a next step.

When the $2^{nd}$ liner 213 is formed on the outer surface of the $2^{nd}$ source/drain pattern 235, the $2^{nd}$ liner 213 may also be formed to surround the $1^{st}$ source/drain pattern 135 with the $1^{st}$ portion 109A of the $1^{st}$ liner 109 thereon. Thus, the outer surface of the $1^{st}$ source/drain pattern 135 may be surrounded by two liners, that is, the $1^{st}$ liner 109 ($1^{st}$ portion 109A) and the $2^{nd}$ liner 213.

The formation of the $2^{nd}$ liner 213 may be performed by depositing a nitride material such as silicon nitride or a composite thereof (e.g., SiN, $Si_3N_4$, SiBCN, SiCN, SiOC, SiOCN, etc.) through, for example, atomic layer deposition (ALD), not being limited thereto. The $2^{nd}$ liner 213 may be formed of the same material of the $1^{st}$ liner 109. Thus, after formation of the $2^{nd}$ liner 213 on the $1^{st}$ liner 109 ($1^{st}$ portion 109A), the two liners 213 and 109 may form a single liner on the outer surface of the $1^{st}$ source/drain pattern 135.

Referring to FIG. 3D, a $2^{nd}$ isolation layer 217 may be formed to surround the $2^{nd}$ source/drain pattern 235 with the $2^{nd}$ liner 213 thereon, and a portion of the $2^{nd}$ isolation layer 217 above the top surface of the $1^{st}$ source/drain pattern 135 may be patterned to form a recess R2 which exposes the $1^{st}$ source/drain pattern 135.

The $2^{nd}$ isolation layer 217 may be formed to isolate the $2^{nd}$ source/drain pattern 235 from other circuit elements including the $1^{st}$ source/drain pattern 135. A low-k dielectric material which may be the same as the low-k dielectric material forming the $1^{st}$ isolation layer 117 may be formed through, for example, PVD, CVD, PECVD, or a combination thereof, not being limited thereto, followed by planarization on top.

Next, the recess R2, in which a contact structure is to be formed to contact the $1^{st}$ source/drain pattern 135, for example, the top surface thereof, in a next step, may be formed in the non-overlapping region where the $1^{st}$ source/drain pattern 135 is not overlapped by the $2^{nd}$ source/drain pattern 235 in the $3^{rd}$ direction D3. For example, in the non-overlapping region, the recess R2 may penetrate through the $2^{nd}$ isolation layer 217, the $2^{nd}$ liner 213, and the $1^{st}$ portion 109A of the $1^{st}$ liner 109 to contact the $1^{st}$ source/drain pattern 135. The formation of the recess R2 may be performed through, for example, dry etching and/or wet etching, not being limited thereto.

Here, however, unlike the recess R1 formed in the intermediate semiconductor device shown in FIG. 2M, the recess R2 may penetrate only the $2^{nd}$ isolation layer 217, the $2^{nd}$ liner 213 and the $1^{st}$ portion 109A of the $1^{st}$ liner 109 to contact the $1^{st}$ source/drain pattern 135. Thus, the contact area may be simplified in the intermediate semiconductor device in the present embodiment, compared to the previous embodiment shown in FIG. 2M, thereby to avoid etching difficulties that may be encountered in forming the recess R1 (FIG. 2M) through the $2^{nd}$ isolation layer 217, the liner portion 109C of the $1^{st}$ liner 109, the gap portion 117T of the $1^{st}$ isolation layer 117, the $2^{nd}$ liner 213, and the $1^{st}$ portion 109A of the $1^{st}$ liner 109.

Figure 3E:
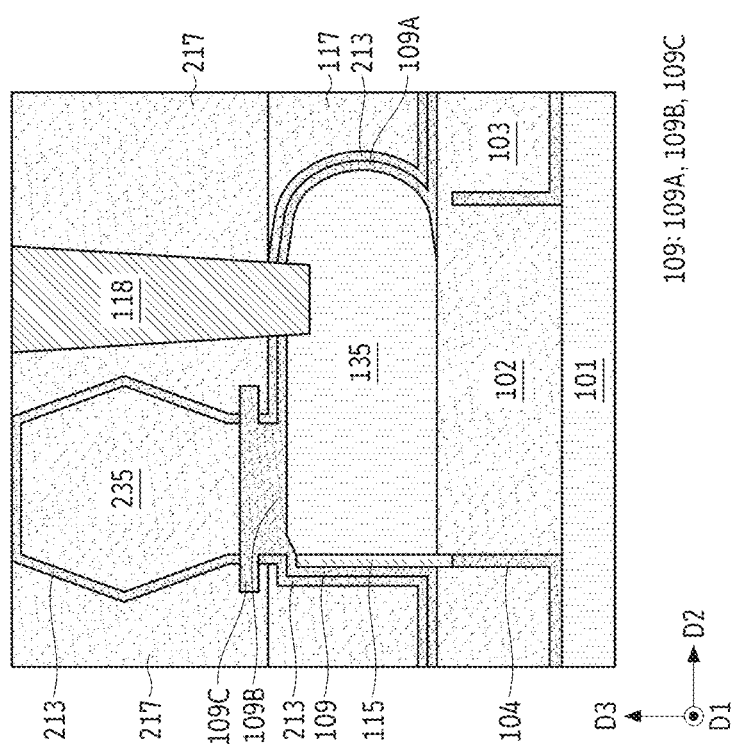

Referring to FIG. 3E, a contact structure 118 may be formed in the recess R to contact the $1^{st}$ source/drain pattern 135.

The contact structure 118 may connect the $1^{st}$ source/drain pattern 135 to a voltage source or another circuit element for signal routing. The contact structure 118 may be formed of copper (Cu), tungsten (W), aluminum (Al), ruthenium (Ru), molybdenum (Mo), etc., not being limited thereto.

Figure 4:
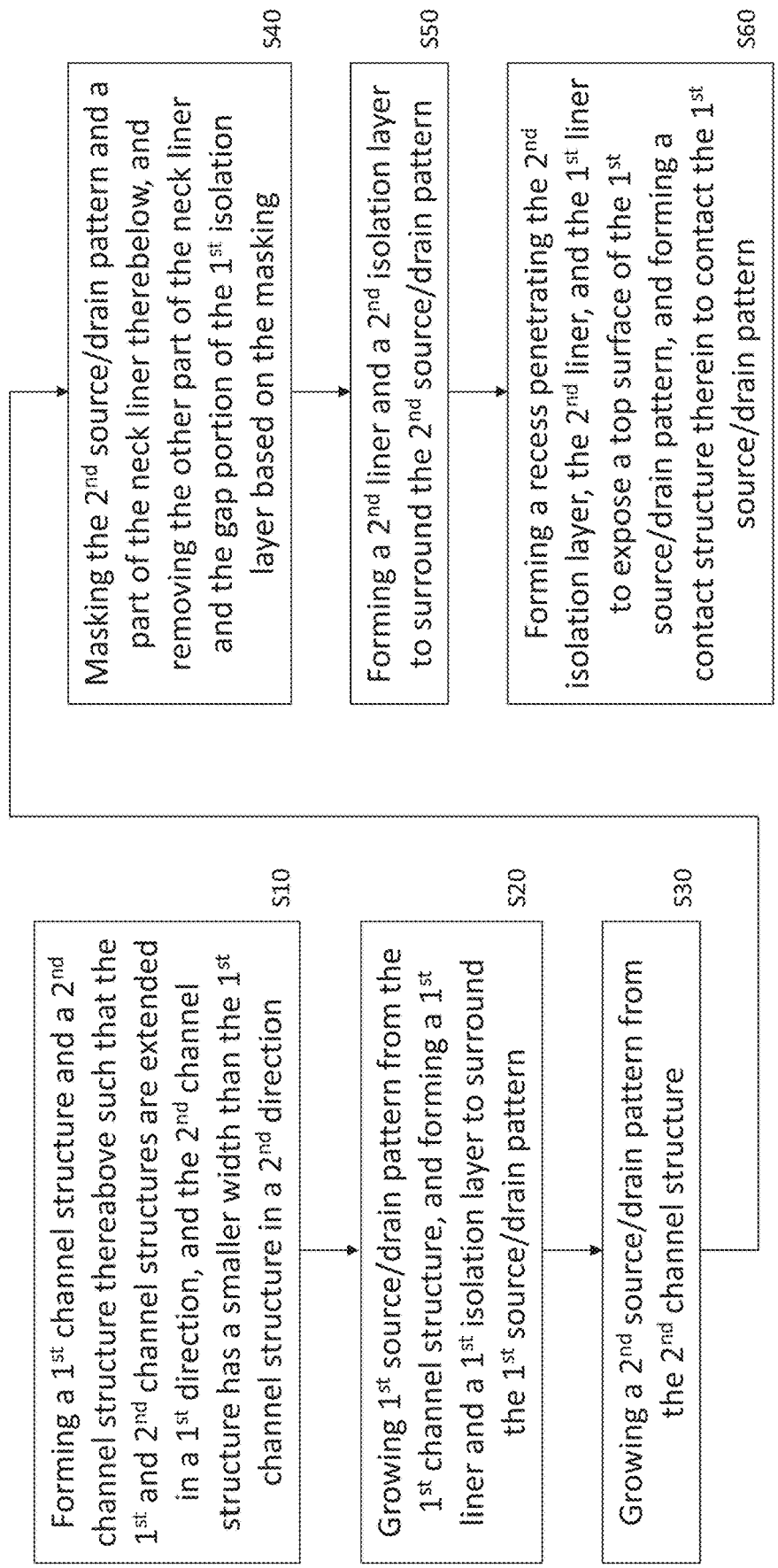
FIG. 4 illustrates a flowchart of a method of manufacturing a 3D-stacked semiconductor device having a simplified contact area in reference to FIGS. 2A-2K and 3A-3E, according to one or more other embodiments.

FIG. 4 illustrates a flowchart of a method of manufacturing a 3D-stacked semiconductor device having a simplified contact area in reference to FIGS. 2A-2K and 3A-3E, according to one or more other embodiments.

The semiconductor device manufactured according to the flowchart of FIG. 4 may be the same as or correspond to the 3D-stacked semiconductor device shown in FIG. 3E, and operations performed for each step of manufacturing the 3D-stacked semiconductor device may be the same as or similar to those described above in reference to FIGS. 3A-3E. Thus, duplicate descriptions may be omitted herein.

In step S10, a $1^{st}$ channel structure and a $2^{nd}$ channel structure above the $1^{st}$ channel structure may be formed such that the $1^{st}$ and $2^{nd}$ channel structures are extended in the $1^{st}$ direction D1, and the $2^{nd}$ channel structure has a smaller width than the $1^{st}$ channel structure in the $2^{nd}$ direction D2 (FIGS. 2A-2E). Each of the $1^{st}$ channel structure and the $2^{nd}$ channel structure may include a plurality of sacrificial layers and channel layers alternately stacked in the $3^{rd}$ direction.

In step S20, a $1^{st}$ source/drain pattern may be grown from the $1^{st}$ channel structure, and a $1^{st}$ liner and a $1^{st}$ isolation layer may be formed to surround the $1^{st}$ source/drain pattern (FIGS. 2F-2J). The $1^{st}$ liner and the $1^{st}$ isolation layer may be formed such that the $1^{st}$ liner is extended in the $2^{nd}$ direction and includes a $1^{st}$ portion on the $1^{st}$ source/drain pattern and a liner portion above the $1^{st}$ portion with a gap portion of the $1^{st}$ isolation layer therebetween. The $1^{st}$ liner may be formed of a nitride material such as silicon nitride, and the $1^{st}$ isolation layer may be formed of an oxide material such as silicon oxide In step S30, a $2^{nd}$ source/drain pattern may be grown from the $2^{nd}$ channel structure (FIG. 3A).

In step S40, the $2^{nd}$ source/drain pattern and a part of the liner portion therebelow may be masked, and the other part of the liner portion and the gap portion of the $1^{st}$ isolation layer may be removed based on the masking (FIG. 3B).

In step S50, a $2^{nd}$ liner and a $2^{nd}$ isolation layer may be formed to surround the $2^{nd}$ source/drain pattern (FIG. 3C). The $2^{nd}$ liner may also be formed on the $1^{st}$ liner on the $1^{st}$ source/drain pattern. The $2^{nd}$ liner and the $2^{nd}$ isolation layer may be formed of the same materials forming the $1^{st}$ liner and the $1^{st}$ isolation layer, respectively.

In step S60, a recess penetrating the $2^{nd}$ isolation layer, the $2^{nd}$ liner, and the $1^{st}$ liner to expose a top surface of the $1^{st}$ source/drain pattern may be formed, and a contact structure may be formed therein to contact the $1^{st}$ source/drain pattern (FIGS. 3D-3E).

Through the above method and steps, a 3D-stacked semiconductor device, in which a contact area for a contact structure contacting a lower source/drain pattern for a lower transistor is simplified, may be manufactured.

FIG. 5 is a schematic block diagram illustrating an electronic device including a 3D-stacked semiconductor device having a simplified contact area, according to one or more embodiments.

Referring to FIG. 5, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data necessary for the core 1011, the DSP 1012, and the GPU 1013 to operate. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include at least one of the 3D-stacked semiconductor devices shown in FIGS. 2N and 3E, respectively.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:
    a $1^{st}$ channel structure extended in a $1^{st}$ direction;
    a $2^{nd}$ channel structure extended in the $1^{st}$ direction above the $1^{st}$ channel structure, the $2^{nd}$ channel structure having a smaller width than the $1^{st}$ channel structure in a $2^{nd}$ direction intersecting the $1^{st}$ direction;
    a $1^{st}$ source/drain pattern on the $1^{st}$ channel structure;
    a $2^{nd}$ source/drain pattern on the $2^{nd}$ channel structure, the $2^{nd}$ source/drain pattern having a smaller width than the $1^{st}$ source/drain pattern in the $2^{nd}$ direction;
    a $1^{st}$ liner on the $1^{st}$ source/drain pattern; and
    a $1^{st}$ isolation layer surrounding the $1^{st}$ source/drain pattern with the $1^{st}$ liner thereon,
    wherein the $1^{st}$ liner comprises:
        a $1^{st}$ portion surrounding an outer surface of the $1^{st}$ source/drain pattern; and
        a liner portion protruded from the $1^{st}$ portion toward the $2^{nd}$ source/drain pattern in a $3^{rd}$ direction intersecting the $1^{st}$ direction and the $2^{nd}$ direction.

2. The semiconductor device of claim 1, wherein the $1^{st}$ isolation layer and the $1^{st}$ liner comprise different materials.

3. The semiconductor device of claim 2, wherein the $1^{st}$ isolation layer comprises an oxide material, and the $1^{st}$ liner comprises a nitride material.

4. The semiconductor device of claim 1, wherein the liner portion has a greater width than the $2^{nd}$ source/drain pattern in the $2^{nd}$ direction.

5. The semiconductor device of claim 1, wherein a part of the liner portion is above the $1^{st}$ source/drain pattern with a gap portion of the $1^{st}$ isolation layer therebetween in the $3^{rd}$ direction.

6. The semiconductor device of claim 5, further comprising:
    a $2^{nd}$ isolation layer surrounding the $2^{nd}$ source/drain pattern; and
    a contact structure penetrating the $2^{nd}$ isolation layer, the part of the liner portion, the gap portion of the $1^{st}$ isolation layer, and the $1^{st}$ portion of the $1^{st}$ liner to contact the $1^{st}$ source/drain pattern.

7. The semiconductor device of claim 6, further comprising a $2^{nd}$ liner on the $2^{nd}$ source/drain pattern and the $1^{st}$ portion of the $1^{st}$ liner,
    wherein the contact structure penetrates the $2^{nd}$ liner to contact the $1^{st}$ source/drain pattern.

8. The semiconductor device of claim 1, wherein the liner portion has a smaller width than the $1^{st}$ source/drain pattern in the $2^{nd}$ direction.

9. The semiconductor device of claim 8, further comprising:
    a $2^{nd}$ isolation layer surrounding the $2^{nd}$ source/drain pattern; and
    a contact structure penetrating the $2^{nd}$ isolation layer and the $1^{st}$ portion of the $1^{st}$ liner to contact the $1^{st}$ source/drain pattern.

10. The semiconductor device of claim 9, further comprising a $2^{nd}$ liner on the $2^{nd}$ source/drain pattern and the $1^{st}$ portion of the $1^{st}$ liner,
    wherein the contact structure penetrates the $2^{nd}$ liner to contact the $1^{st}$ source/drain pattern.

11. The semiconductor device of claim 9, wherein the contact structure does not penetrate the liner portion of the $1^{st}$ liner to contact the $1^{st}$ source/drain pattern.

12. The semiconductor device of claim 1, further comprising a sidewall spacer on only one side surface of the $1^{st}$ source/drain pattern among two opposite side surfaces thereof.

13. A semiconductor device comprising:
 a $1^{st}$ source/drain pattern for a $1^{st}$ transistor;
 a $2^{nd}$ source/drain pattern for a $2^{nd}$ transistor, above the $1^{st}$ source/drain pattern, the $2^{nd}$ source/drain pattern having a smaller width than the $1^{st}$ source/drain pattern in a channel-width direction;
 a $1^{st}$ isolation layer surrounding the $1^{st}$ source/drain pattern;
 a $2^{nd}$ isolation layer surrounding the $2^{nd}$ source/drain pattern, the $1^{st}$ and $2^{nd}$ isolation layers comprising a first material;
 a liner surrounding the $1^{st}$ source/drain pattern, the liner comprising a $2^{nd}$ material; and
 a contact structure on the $1^{st}$ source/drain pattern,
 wherein the contact structure penetrates the $2^{nd}$ isolation layer and the liner to contact the $1^{st}$ source/drain pattern without penetrating the $1^{st}$ isolation layer.

14. The semiconductor device of claim 13, wherein the $1^{st}$ material comprises an oxide material, and the $2^{nd}$ material comprises a nitride material.

15. The semiconductor device of claim 13, wherein the contact structure does not penetrate another layer comprising the $1^{st}$ material or the $2^{nd}$ material between the $2^{nd}$ isolation layer and the liner.

16. The semiconductor device of claim 13, further comprising a sidewall spacer on only one side surface of the $1^{st}$ source/drain pattern among two opposite side surfaces thereof.

17. A method of manufacturing a semiconductor device, the method comprising:
 forming a $1^{st}$ channel structure and a $2^{nd}$ channel structure above the $1^{st}$ channel structure such that the $1^{st}$ and $2^{nd}$ channel structures are extended in a $1^{st}$ direction, and the $2^{nd}$ channel structure has a smaller width than the $1^{st}$ channel structure in a $2^{nd}$ direction intersecting the $1^{st}$ direction;
 forming a $1^{st}$ source/drain pattern on the $1^{st}$ channel structure;
 forming a $1^{st}$ liner on the $1^{st}$ source/drain pattern;
 forming a $1^{st}$ isolation layer surrounding the $1^{st}$ source/drain pattern with the $1^{st}$ liner thereon;
 forming a $2^{nd}$ source/drain pattern on the $2^{nd}$ channel structure;
 forming a $2^{nd}$ isolation layer surrounding the $2^{nd}$ source/drain pattern; and
 forming a contact structure such that the contact structure penetrates the $2^{nd}$ isolation layer and the liner to contact the $1^{st}$ source/drain pattern without penetrating the $1^{st}$ isolation layer.

18. The method of claim 17, wherein the $1^{st}$ material comprises an oxide material, and the $2^{nd}$ material comprises a nitride material.

19. The method of claim 17, wherein the contact structure is formed such that the contact structure does not penetrate another layer comprising the $1^{st}$ material or the $2^{nd}$ material between the $2^{nd}$ isolation layer and the liner.

20. The method of claim 17, further comprising forming a sidewall spacer on only one side surface of the $1^{st}$ source/drain pattern among two opposite side surfaces thereof.

* * * * *